US011733268B2

(12) United States Patent
Sato et al.

(10) Patent No.: US 11,733,268 B2
(45) Date of Patent: Aug. 22, 2023

(54) PROBE PIN INSPECTION MECHANISM AND INSPECTION APPARATUS

(71) Applicant: KABUSHIKI KAISHA TOSHIBA, Minato-ku (JP)

(72) Inventors: Shingo Sato, Kashiwazaki (JP); Akihiro Takahashi, Kashiwazaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 239 days.

(21) Appl. No.: 17/414,224

(22) PCT Filed: Dec. 17, 2018

(86) PCT No.: PCT/JP2018/046417
§ 371 (c)(1),
(2) Date: Jun. 15, 2021

(87) PCT Pub. No.: WO2020/129135
PCT Pub. Date: Jun. 25, 2020

(65) Prior Publication Data
US 2022/0065896 A1 Mar. 3, 2022

(51) Int. Cl.
*G01R 1/073* (2006.01)
*G01R 1/067* (2006.01)
*G01R 31/36* (2020.01)

(52) U.S. Cl.
CPC ..... *G01R 1/07314* (2013.01); *G01R 1/06722* (2013.01); *G01R 31/36* (2013.01)

(58) Field of Classification Search
CPC . G01R 1/07314; G01R 1/06722; G01R 31/36
See application file for complete search history.

(56) References Cited

U.S. PATENT DOCUMENTS 4,926,119 A * 5/1990 Prokopp ............ G01R 1/07378
324/756.07
6,391,667 B1 5/2002 Hashimoto
(Continued)

FOREIGN PATENT DOCUMENTS

JP 2004-286497 A 10/2004
JP 4209707 B2 1/2009
(Continued)

OTHER PUBLICATIONS

International Search Report dated Mar. 12, 2019 in PCT/JP2018/046417 filed on Dec. 17, 2018 (2 pages).

*Primary Examiner* — Paresh Patel
(74) *Attorney, Agent, or Firm* — Maier & Maier, PLLC (57) ABSTRACT

A probe pin inspection mechanism a includes a base, a pair of movable bodies, a pair of movable-body elastic bodies, and a conductor. The movable bodies are supported by the base to be movable in a first direction from a first position with respect to the base, and respectively include ends and terminals electrically connected to the respective ends. The movable-body elastic bodies elastically press the movable bodies in a second direction. The conductor is supported by the base and electrically connects the terminals of the movable bodies by making contact with the terminals. The state between the terminals and the conductor is switched, according to the position of the movable bodies, between a conductive state in which the terminals and the conductor are in contact with each other and a non-conductive state in which the terminals and the conductor are separated from each other.

8 Claims, 11 Drawing Sheets

(56) References Cited

U.S. PATENT DOCUMENTS

| | | | | |
|---|---|---|---|---|
| 8,106,672 | B2* | 1/2012 | Kurosawa | G01R 1/07314 |
| | | | | 324/754.01 |
| 9,069,011 | B2* | 6/2015 | Walcher | G01R 1/0408 |
| 11,502,440 | B2* | 11/2022 | Volkov | H01R 12/7082 |
| 2014/0266008 | A1* | 9/2014 | Partee | H01M 10/441 |
| | | | | 320/152 |

FOREIGN PATENT DOCUMENTS

| | | |
|---|---|---|
| JP | 4368027 B2 | 11/2009 |
| JP | 2013-55805 A | 3/2013 |
| JP | 2013-238554 A | 11/2013 |
| JP | 2016-018634 A | 2/2016 |

* cited by examiner

PROBE PIN INSPECTION MECHANISM AND INSPECTION APPARATUS

CROSS-REFERENCE TO RELATED APPLICATIONS

This application is a national stage application of International Application No. PCT/JP2018/046417, filed Dec. 17, 2018, which designates the United States, the entire contents of which are incorporated herein by reference.

TECHNICAL FIELD

Embodiments described herein relate generally to a probe pin inspection mechanism and an inspection apparatus.

BACKGROUND ART

Conventionally, there is known a charge-discharge inspection apparatus that inspects a secondary battery in a state where a pair of probe pins are pushed against a pair of electrode terminals of the secondary battery, for example.

A probe pin inspection mechanism according an embodiment includes a base, a pair of movable bodies, a pair of movable-body elastic bodies, and a conductor. The pair of movable bodies respectively include ends and terminals, each of the pair of movable bodies being supported by the base to be movable in a first direction from a first position with respect to the base, the ends being located in a second direction opposite to the first direction, the terminals being electrically connected to the respective ends, and the pair of movable bodies being arranged in a direction intersecting the first direction. The pair of movable-body elastic bodies are provided for the respective movable bodies and interposed between the respective movable bodies and the base, the pair of movable-body elastic bodies elastically pressing the respective movable bodies in the second direction. The conductor is supported by the base, the conductor electrically connecting the terminals of the pair of movable bodies by making contact with the terminals. The ends of the pair of movable bodies are capable of making contact with respective probe pins. A state between the terminals and the conductor is switched, according to a position of the movable bodies, between a conductive state in which the terminals and the conductor are in contact with each other and a non-conductive state in which the terminals and the conductor are separated from each other.

DESCRIPTION OF EMBODIMENTS

According to an embodiment, a probe pin inspection mechanism includes a base, a pair of movable bodies, a pair of movable-body elastic bodies, and a conductor. The pair of movable bodies respectively include ends and terminals, each of the pair of movable bodies being supported by the base to be movable in a first direction from a first position with respect to the base, the ends being located in a second direction opposite to the first direction, the terminals being electrically connected to the respective ends, and the pair of movable bodies being arranged in a direction intersecting the first direction. The pair of movable-body elastic bodies are provided for the respective movable bodies and interposed between the respective movable bodies and the base, the pair of movable-body elastic bodies elastically pressing the respective movable bodies in the second direction. The conductor is supported by the base, the conductor electrically connecting the terminals of the pair of movable bodies by making contact with the terminals. The ends of the pair of movable bodies are capable of making contact with respective probe pins. A state between the terminals and the conductor is switched, according to a position of the movable bodies, between a conductive state in which the terminals and the conductor are in contact with each other and a non-conductive state in which the terminals and the conductor are separated from each other.

Embodiments will be described below with reference to the drawings. Note that the plurality of illustrative embodiments below contain similar constituent elements. Accordingly, hereinafter, common reference signs are assigned to similar constituent elements and duplicate descriptions thereof are omitted.

Furthermore, in the present specification, ordinal numbers are assigned for the sake of expediency in order to distinguish between members (components) and parts, and so forth, but these ordinal numbers do not denote an order of precedence or a sequential order.

Further, according to the present embodiment, three directions that intersect one another orthogonally are defined for the sake of expediency. Direction X follows the depth direction (front-back direction) of a probe pin inspection mechanism 1; direction Y follows the left-right direction (width direction) of the probe pin inspection mechanism 1;

and direction Z follows the up-down direction (the height direction) of the probe pin inspection mechanism 1. A downward direction D1 is an example of a first direction, and an upward direction D2 is an example of a second direction.

First Embodiment

Figure 1:
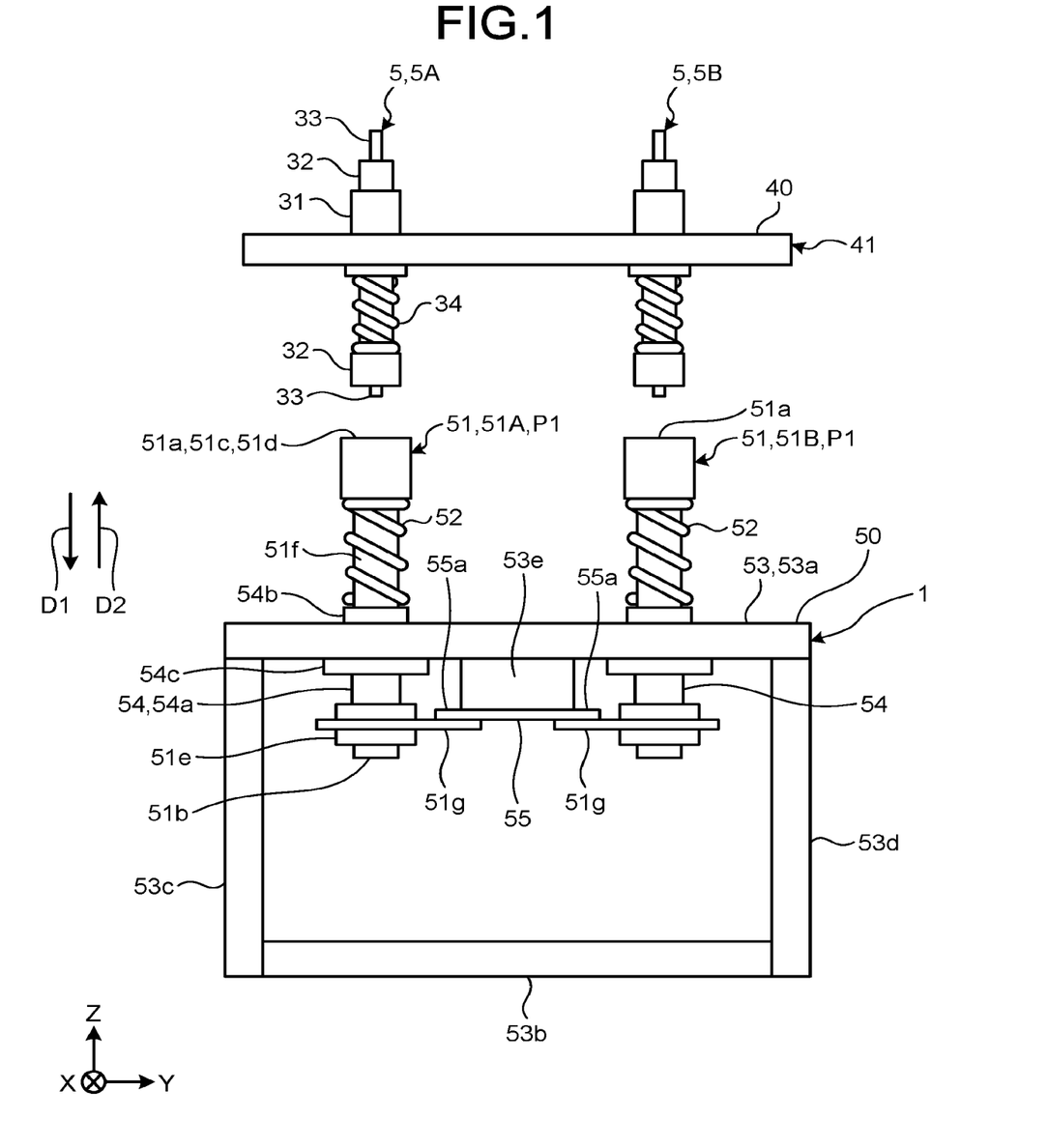
FIG. 1 is an illustrative front elevation of a probe pin inspection mechanism and a probe pin module according to a first embodiment.

FIG. 1 is an illustrative front elevation of a probe pin inspection mechanism and a probe pin module according to a first embodiment. The probe pin inspection mechanism 1 illustrated in FIG. 1 is used to inspect a pair of probe pins 5. The pair of probe pins 5 are used in a charge-discharge inspection of a secondary battery 10 (see FIG. 2), for example. Hereinafter, the secondary battery, the probe pins, and the probe pin inspection mechanism will be described in detail and in that order.

Figure 2:
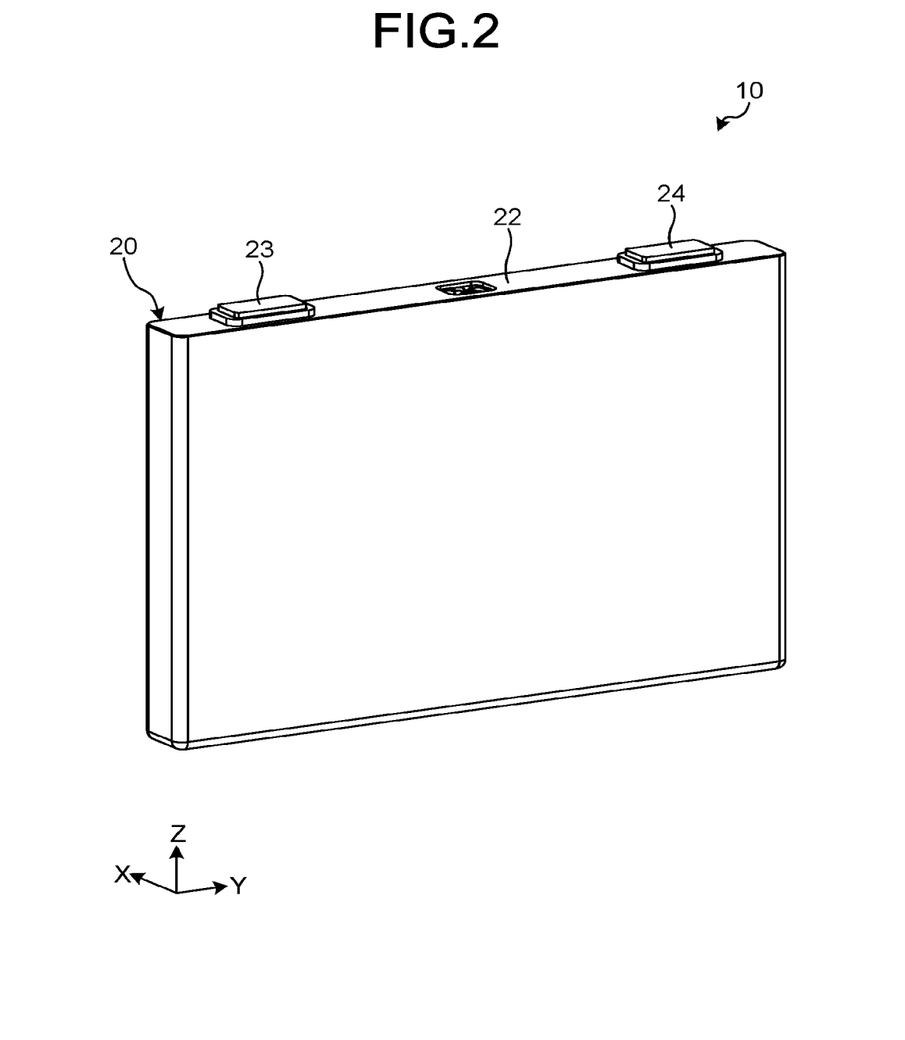
FIG. 2 is an illustrative perspective view of a secondary battery according to the first embodiment.

FIG. 2 is an illustrative perspective view of the secondary battery 10 according to the first embodiment. As illustrated in FIG. 2, the secondary battery 10 has an enclosure 20, a cathode terminal 23, and an anode terminal 24. The secondary battery 10 is a lithium-ion secondary battery, for example.

The enclosure 20 is configured to have a flat, rectangular parallelepiped shape. An electrode constituting a power generation unit is housed within the enclosure 20.

The cathode terminal 23 and anode terminal 24 are exposed to the outside of the enclosure 20 in a state of being supported by a top wall 22 of the enclosure 20. The cathode terminal 23 and anode terminal 24 are arranged at an interval from one another in the left-right direction of the top wall 22 (enclosure 20). The cathode terminal 23 and anode terminal 24 are electrically connected to the cathode and anode, respectively, of the electrode. The cathode terminal 23 and anode terminal 24 are each an example of an electrode terminal.

Next, the probe pins 5 will be described in detail. As illustrated in FIG. 1, the pair of probe pins 5 are supported by a base 40 in a state of being arranged in a left-right direction that intersects an up-down direction (upward direction D2 and downward direction D1). Hereinafter, when distinguishing between the plurality of probe pins 5, the pair of probe pins 5 will also be referred to as the probe pins 5A and 5B. The pair of probe pins 5 and the base 40 constitute a probe pin module 41. The probe pin module 41 is also referred to as the probe pin unit.

The probe pins 5 have a support body 31, a first pin 32, a second pin 33, a first pin elastic body 34, and a second pin elastic body (not illustrated). The first pin 32 and second pin 33 are also referred to as contact pins and plungers. The first pin 32 is an example of a pin, and the first pin elastic body 34 is an example of an elastic body for a pin.

The support body 31 is fixed to the base 40 in a state of passing through the base 40 in the up-down direction. The support body 31 has a stepped, cylindrical shape.

The first pin 32 is cylindrical. A portion of the first pin 32 is inserted in the support body 31, and the first pin 32 is capable of sliding in the support body 31. The first pin 32 is guided in the up-down direction by the support body 31. Furthermore, the first pin 32 abuts a stopper in an initial position in which the first pin 32 protrudes from the support body 31 by a predetermined amount in the downward direction D1 such that the downward movement of the first pin 32 is limited by the stopper. In addition, the first pin 32 is pressed in the downward direction D1 by the first pin elastic body 34. Current flows in the first pin 32.

A portion of the second pin 33 is inserted in the first pin 32, and the second pin 33 is capable of sliding in the first pin 32. The second pin 33 is guided in the up-down direction by the first pin 32. Furthermore, the second pin 33 abuts a stopper in an initial position in which the second pin 33 protrudes from the first pin 32 by a predetermined amount in the downward direction D1 such that the downward movement of the second pin 33 is limited by the stopper. In addition, the second pin 33 is pressed in the downward direction D1 by the second pin elastic body. A voltmeter is connected to the second pin 33. In other words, the second pin 33 is used for voltage detection.

Next, the probe pin inspection mechanism 1 will be described in detail. As illustrated in FIG. 1, the probe pin inspection mechanism 1 has a base 50, a pair of movable bodies 51, and a pair of movable-body elastic bodies 52.

The base 50 has a frame 53 and a guide member 54.

The frame 53 is in the form of a substantially rectangular frame, and has a top wall 53a, a bottom wall 53b, and a pair of side walls 53c and 53d. The width of the frame 53 (the base 50) in the left-right direction and the width (length) thereof in the depth direction are the same as the width of the enclosure 20 of the secondary battery 10 in the left-right direction and the width (length) thereof in the depth direction. The base 50 is made of an insulating material such as a synthetic resin material. The frame 53 is also referred to as the body.

A protruding portion 53e is provided to the lower surface of the top wall 53a. The protruding portion 53e protrudes in the downward direction D1 from the top wall 53a. In addition, a conductor 55 is fixed to the tip portion of the protruding portion 53e. That is, the conductor 55 is supported by the frame 53. The conductor 55 is in the form of a flat plate. The conductor 55 has a pair of terminals 55a at both ends in the left-right direction of the conductor 55. The conductor 55 is made of a metallic material and is electrically conductive.

The guide member 54 has a tubular portion 54a, an upper flange portion 54b, and a lower flange portion 54c. The tubular portion 54a has a cylindrical shape, for example. The tubular portion 54a extends in the up-down direction and passes through the top wall 53a of the frame 53 in the up-down direction. The upper flange portion 54b and the lower flange portion 54c each project radially outward of the tubular portion 54a from the outer periphery of the tubular portion 54a. The upper flange portion 54b and the lower flange portion 54c have an annular shape, for example. The upper flange portion 54b overlaps the upper surface of the top wall 53a, and the lower flange portion 54c overlaps the lower surface of the top wall 53a. The guide member 54 is fixed to the top wall 53a due to the top wall 53a being sandwiched between the upper flange portion 54b and the lower flange portion 54c. The guide member 54 may be configured from a combination of a plurality of members.

The pair of movable bodies 51 are disposed on the top wall 53a of the base 50 in a state of being arranged in a left-right direction that intersects the up-down direction (upward direction D2 and downward direction D1). Hereinafter, when the pair of movable bodies 51 are described so as to be distinguished from one another, the pair of movable bodies 51 are also referred to as the movable body 51A and movable body 51B.

The movable bodies 51 have an upper end 51a and a lower end 5b. The respective upper ends 51a of the pair of movable bodies 51 are capable of making contact with separate probe pins 5. More specifically, the upper end 51a of the movable body 51A is capable of making contact with probe pin 5A, and the upper end 51a of the movable body 51B is capable of making contact with probe pin 5B.

The movable bodies 51 have a cylindrical portion 51c with a stepped shape that includes the upper end 51a and lower end 51b; and a terminal 51g that projects from the cylindrical portion 51c. The movable bodies 51 are made of a metallic material and are electrically conductive. In other words, the upper end 51a is electrically conductive.

The cylindrical portion 51c has an upper large-diameter portion 51d, a lower large-diameter portion 51e, and a connecting portion 51f. The upper large-diameter portion 51d includes the upper end 51a. The upper large-diameter portion 51d and lower large-diameter portion 51e are each cylindrical. The upper large-diameter portion 51d and the lower large-diameter portion 51e are spaced apart in the up-down direction. The upper large-diameter portion 51d is located above the top wall 53a, and the lower large-diameter portion 51e is located below the top wall 53a. The connecting portion 51f exists between the upper large-diameter portion 51d and the lower large-diameter portion 51e and connects the upper large-diameter portion 51d and the lower large-diameter portion 51e. The connecting portion 51f is cylindrical. The diameter of the connecting portion 51f is smaller than the respective diameters of the upper large-diameter portion 51d and lower large-diameter portion 51e. A portion of the connecting portion 51f between the upper large-diameter portion 51d and lower large-diameter portion 51e is inserted into the tubular portion 54a of the guide member 54, and thus the connecting portion 51f is capable of sliding in the tubular portion 54a. The connecting portion 51f and thus the movable bodies 51 are guided in the tubular portion 54a in the up-down direction.

In a state in which the movable bodies 51 are located in a first position P1 with respect to the base 50, the lower end of the tubular portion 54a of the guide member 54 makes contact in the up-down direction with the lower large-diameter portion 51e, and movement of the movable bodies 51 in the upward direction D2 is limited by the tubular portion 54a. In other words, the tubular portion 54a functions as a stopper. The movable bodies 51 are supported by the base 50 so as to be capable of moving in the downward direction D1 from the first position P1. The first position P1 is also referred to as the initial position.

The terminal 51g projects radially outward of the cylindrical portion 51c from the lower large-diameter portion 51e. The terminal 51g is in the form of a band plate. The terminal 51g is electrically connected to the upper end 51a via the cylindrical portion 51c. The terminal 51g is capable of making contact with the lower surface of the terminals 55a of the conductor 55. More specifically, the terminal 51g of the movable body 51A is capable of making contact with one (left-side) terminal 55a, and the terminal 51g of the movable body 51B is capable of making contact with the other (right-side) terminal 55a. In a state in which the movable bodies 51 are located in the first position P1, the terminals 51g make contact with the lower surface of the terminals 55a of the conductor 55 and are electrically connected to the conductor 55. The terminal 51g can thus be electrically connected to the conductor 55.

The movable-body elastic bodies 52 are provided for each of the movable bodies 51. The movable-body elastic bodies 52 are coil springs. The movable-body elastic bodies 52 are interposed in a compressed state between the upper large-diameter portion 51d of the movable bodies 51 and the upper flange portion 54b of the guide member 54 of the base 50. The movable-body elastic bodies 52 elastically press the movable bodies 51 in the upward direction D2.

The movable bodies 51 are held in the first position P1 by being elastically pressed in the upward direction D2 by the movable-body elastic bodies 52 in a state in which the lower flange portion 54c of the guide member 54 makes contact in the up-down direction with the lower large-diameter portion 51e. As mentioned earlier, in a state in which the movable bodies 51 are located in the first position P1, the terminals 51g make contact with the lower surface of the terminals 55a of the conductor 55 and are electrically connected to the conductor 55. The state in which both terminals 51g of the pair of movable bodies 51 are in contact with the pair of terminals 55a of the conductor 55 is a conductive state. In other words, the conductive state is a state in which the pair of terminals 51g of the pair of movable bodies 51 are electrically connected. Thus, the conductor 55 electrically connects the terminals 51g by making contact with the terminals 51g of the pair of movable bodies 51.

From the conductive state, the upper ends 51a are pressed in the downward direction D1 under the elastic force of the movable-body elastic bodies 52, whereby the movable bodies 51 move to a position further in the downward direction D1 than the first position P1 and the terminals 51g are separated from the terminals 55a of the conductor 55. A state in which at least one terminal 51g of the pair of movable bodies 51 is separated from the terminals 55a of the conductor 55 is a non-conductive state. A non-conductive state is a state in which the terminals 51g of the pair of movable bodies 51 are electrically disconnected.

As mentioned earlier, in the probe pin inspection mechanism 1, the state between the terminals 51g and the conductor 55 is switched, according to the position of the movable bodies 51, between a conductive state in which the terminals 51g and the conductor 55 are in contact with each other and a non-conductive state in which the terminals 51g and the conductor 55 are separated from each other.

Furthermore, the force (elastic force) exerted by the movable-body elastic bodies 52 which presses the movable bodies 51 located in the first position P1 in the upward direction D2 is greater than the force exerted by the first pin elastic bodies 34 of the normal probe pins 5 which presses the first pins 32 in the downward direction D1. Here, when the normal probe pins 5 apply a specified pressing force to the first pins 32 in the upward direction D2, the first pins 32 move in the upward direction D2.

In the case of the probe pin inspection mechanism 1 with the foregoing configuration, when the movable bodies 51 are located in the first position P1, the terminals 51g and the conductor 55 are in the conductive state. On the other hand, when the movable bodies 51 are located in a second position P2 (see FIG. 4) further in the downward direction D1 than the first position P1, the terminals 51g and the conductor 55 are in a non-conductive state.

Figure 3:
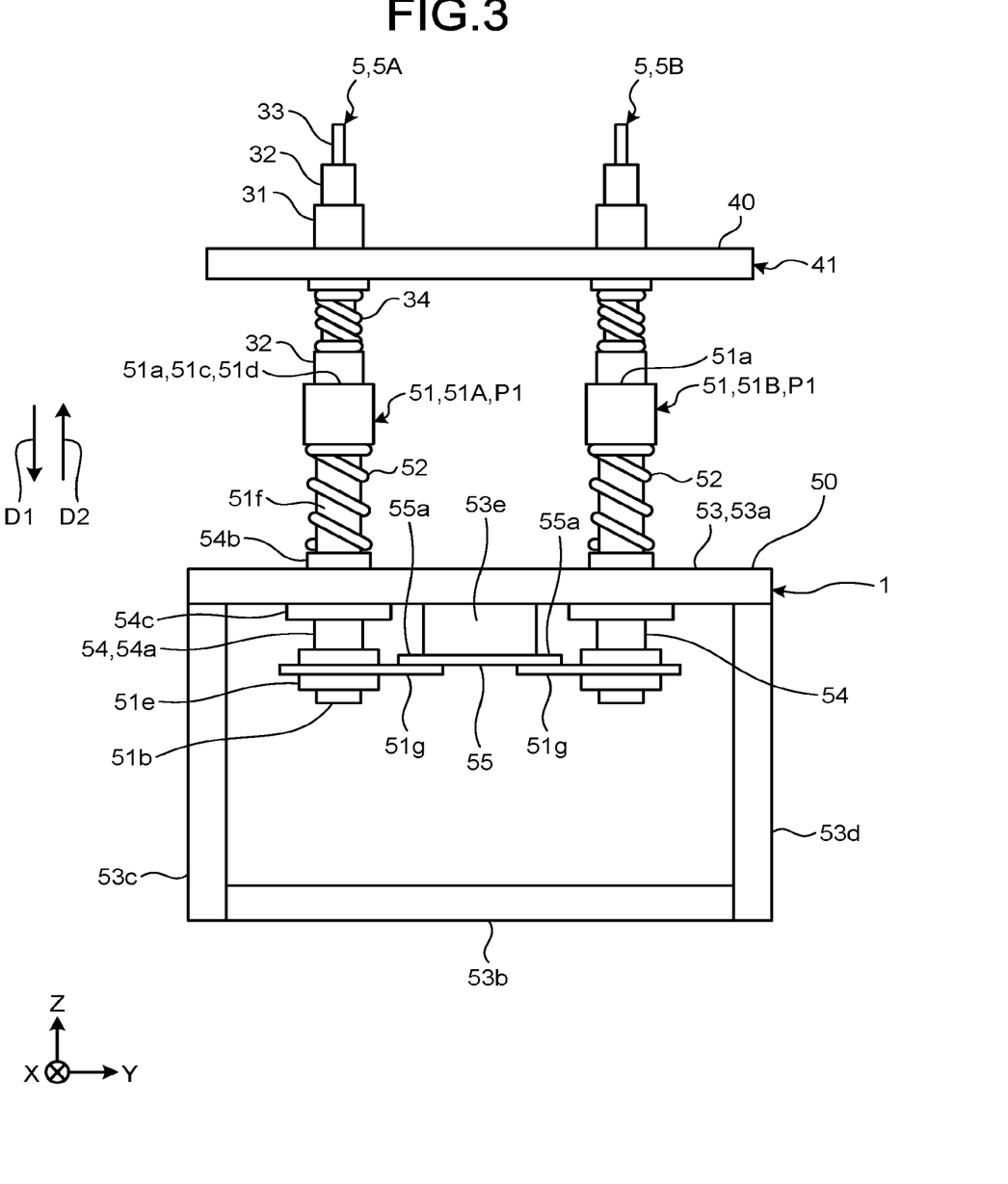
FIG. 3 is an illustrative diagram of a state in which the probe pin inspection mechanism according to the first embodiment is pushed against the probe pin module and illustrates a case where the pair of probe pins are both normal.
Figure 4:
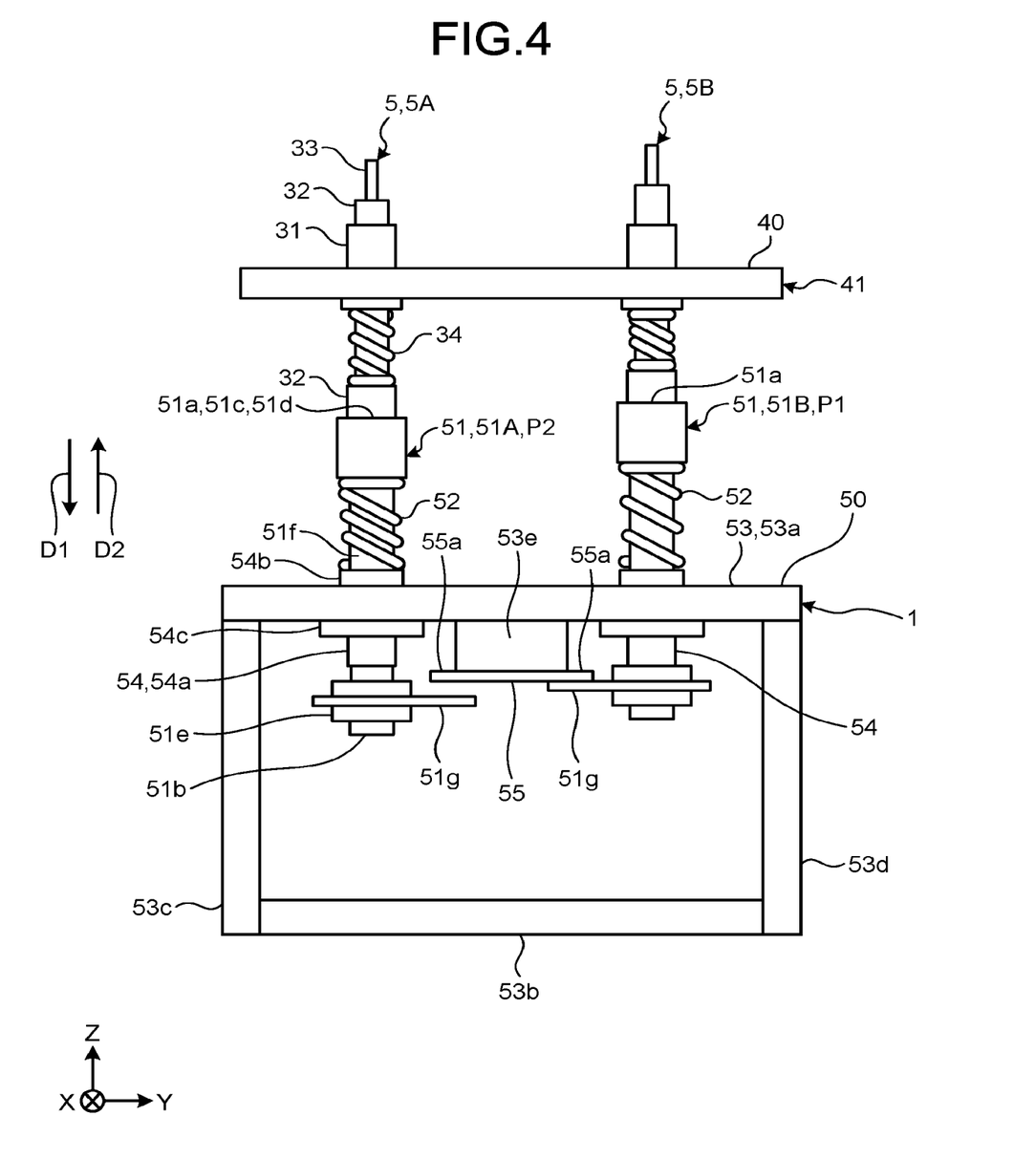
FIG. 4 is an illustrative diagram of a state in which the probe pin inspection mechanism according to the first embodiment is pushed against the probe pin module and illustrates a case where one of the pair of probe pins is abnormal.

Next, an inspection method of the probe pin inspection mechanism 1 using the probe pin inspection mechanism 1 will be described. FIG. 3 is an illustrative diagram of a state in which the probe pin inspection mechanism 1 according to the first embodiment is pushed against the probe pin module 41 and illustrates a case where the pair of probe pins 5 are both normal. FIG. 4 is an illustrative diagram of a state in which the probe pin inspection mechanism 1 according to the first embodiment is pushed against the probe pin module 41 and illustrates a case where one (probe pin 5A) of the pair of probe pins 5 is abnormal.

By bringing the probe pin inspection mechanism 1 and the probe pin module 41 into relative proximity with one another from a state in which the probe pin inspection mechanism 1 and the probe pin module 41 are separated from one another (FIG. 1), the upper ends 51a of the pair of movable bodies 51 are pressed against the respective lower ends of the first pin 32 and second pin 33 of the pair of probe pins 5 (FIGS. 3 and 4). By way of an example, the probe pin inspection mechanism 1 is moved by a specified distance toward the probe pin module 41.

As mentioned earlier, the force (elastic force) which presses the movable bodies 51 located in the first position P1 in the upward direction D2 is greater than the force exerted by the first pin elastic bodies 34 of normal probe pins 5 which presses the first pins 32 in the downward direction D1. Accordingly, when the pair of probe pins 5 are normal, in a state of being located in the position of the first position P1, the movable bodies 51 cause the first pin 32 to move upward relative to the base 40 against the force of the first pin elastic body 34, as illustrated in FIG. 3. In this case, the terminals 51g are electrically connected to the conductor 55 by making contact with the lower surface of the terminals 55a of the conductor 55, and thus the terminals 51g and conductor 55 are in a conductive state. Accordingly, when a voltage is applied between the pair of probe pins 5, current flows between the pair of probe pins 5 via the probe pin inspection mechanism 1. Thus, by detecting the flowing current, it is ascertained that the pair of probe pins 5 are both normal.

On the other hand, when one of the pair of probe pins 5 (probe pin 5A, for example) is abnormal, the second pin 33 of the probe pin 5A does not move upward relative to the base 40 even when pressed upward by the elastic force exerted by the movable-body elastic body 52, that is, when the second pin 33 does not move relative to the base 40, the movable body 51A operates as detailed below. In this case, as illustrated in FIG. 4, the movable body 51A is pressed to the second position P2 further in the downward direction D1 than the first position P1 with respect to the frame 53 due to the elastic force exerted by the first pin elastic body 34 of the probe pin 5A. Accordingly, the terminal 51g is electrically disconnected from the conductor 55 by separating from the lower surface of the terminal 55a of the conductor 55, and thus the terminal 51g and conductor 55 are in a non-conductive state. Thus, current does not flow between the pair of probe pins 5 via the probe pin inspection mechanism 1 even when voltage is applied between the pair of probe pins 5. Thus, by detecting that current is not flowing, it can be ascertained that at least one of the pair of probe pins 5 is abnormal. This abnormality (defect) may be caused by the first pin 32 catching on the support body 31 due to displacement between or rattling of the support body 31 and first pin 32, or the like, for example.

As mentioned earlier, according to the present embodiment, the probe pin inspection mechanism 1 is provided with the base 50, the pair of movable bodies 51, the pair of movable-body elastic bodies 52, and the conductor 55. The pair of movable bodies 51 are each supported by the base 50 so as to be capable of moving in the downward direction D1 (the first direction) from the first position P1 with respect to the base 50. The pair of movable bodies 51 have an upper end 51a (an end) which is capable of making contact with the probe pins 5, and a terminal 51g which is electrically connected to the upper end 51a. The pair of movable bodies 51 are arranged in a direction (left-right direction) intersecting the downward direction D1. The pair of movable-body elastic bodies 52 are provided for each of the movable bodies 51, are interposed between the movable bodies 51 and the base 50, and elastically press the movable bodies 51 in the upward direction D2. The conductor 55 is supported by the base 50 and electrically connects the terminals 51g of the pair of movable bodies 51 by making contact with the terminals 51g. The respective upper ends 51a of the pair of movable bodies 51 are capable of making contact with separate probe pins 5. The state between the terminals 51g and the conductor 55 is switched, according to the position of the movable bodies 51, between a conductive state in which the terminals 51g and the conductor 55 are in contact with each other and a non-conductive state in which the terminals 51g and the conductor 55 are separated from each other. Due to this configuration, because it is possible to inspect the pair of probe pins 5 simultaneously (in the same process), a shortening of the time required to inspect whether the pair of probe pins 5 are normal is facilitated in comparison with a case where the pair of probe pins 5 are inspected separately.

Furthermore, according to the present embodiment, the probe pins 5 have a support body 31, a first pin 32 (a pin) that is supported by the support body 31 so as to be capable of moving in the upward direction D2 and that is capable of making contact with the upper end 51a protruding in the downward direction D1 from the support body 31; and a first pin elastic body 34 (a pin elastic body) that presses the first pin 32 in the downward direction D1. The force exerted by the movable-body elastic bodies 52 which presses the movable bodies 51 located in the first position P1 in the upward direction D2 is greater than the force exerted by the first pin elastic bodies 34 of normal probe pins 5 which presses the first pins 32 in the downward direction D1. Due to this configuration, when the probe pins 5 are normal, the movable bodies 51 are located in the first position P1 even when pressed by the probe pins 5.

Second Embodiment

Figure 5:
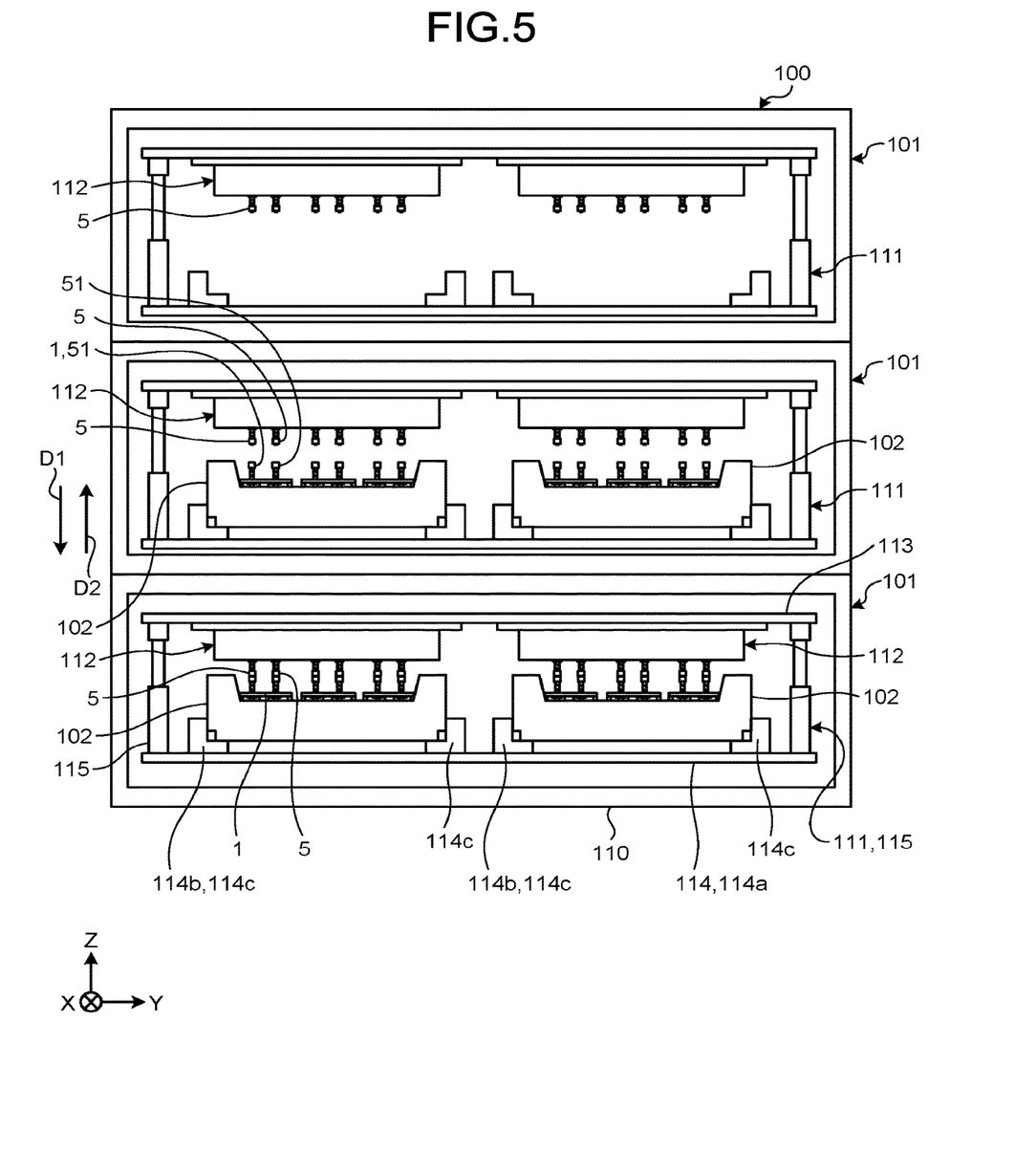
FIG. 5 is an illustrative front elevation of a charge-discharge inspection apparatus according to a second embodiment.

FIG. 5 is an illustrative front elevation of a charge-discharge inspection apparatus 100 according to a second embodiment. The present embodiment is an example of a charge-discharge inspection apparatus 100 in which the probe pin inspection mechanism 1 according to the first embodiment is provided.

The charge-discharge inspection apparatus 100 is capable of performing a charge-discharge inspection of the secondary battery 10 and an inspection of the probe pins 5. The charge-discharge inspection apparatus 100 has a plurality of inspection modules 101, and a tray 102. Note that the quantities of inspection modules 101 and trays 102 are not limited to or by the example illustrated in FIG. 5 and may be different from the quantities illustrated in FIG. 5. The charge-discharge inspection apparatus 100 is an example of an inspection apparatus. Furthermore, the inspection apparatus may also be an inspection apparatus other than the charge-discharge inspection apparatus 100.

The plurality of inspection modules 101 are stacked on one another in an up-down direction. The inspection modules 101 have an enclosure 110, a movement mechanism 111, and a probe pin module 112.

The enclosure 110 is in the form of a rectangular frame. The movement mechanism 111 and the probe pin module 112 are housed within the enclosure 110.

The movement mechanism 111 has a base plate 113, a stage 114, and a plurality of telescopic mechanisms 115. The base plate 113 is fixed to the inspection module 101. The base plate 113 is also referred to as the base.

The stage 114 is provided at an interval from the base plate 113 in the up-down direction. More specifically, the stage 114 is located below the base plate 113. The stage 114 has a plate portion 114a and two support portions 114b. The support portions 114b have a pair of rails 114c. The pair of rails 114c each extend along the depth direction of the enclosure 110 (direction X) and are arranged at an interval from each other in the left-right direction. The support portions 114b are each capable of supporting one tray 102. In other words, one stage 114 is capable of supporting two trays 102.

Furthermore, the pair of rails 114c are capable of guiding the tray 102 along the depth direction (direction X) of the enclosure 110.

The plurality of telescopic mechanisms 115 are interposed between the base plate 113 and the stage 114. The plurality of telescopic mechanisms 115 are capable of expanding and contracting in the up-down direction. By expanding and contracting in the up-down direction under the driving force of a drive source (not illustrated), the plurality of telescopic mechanisms 115 cause the base plate 113 and the stage 114 to move relative to each other in the up-down direction. More specifically, the plurality of telescopic mechanisms 115 cause the stage 114 to move in the up-down direction. The telescopic mechanisms 115 may be configured, for example, from oil hydraulic cylinders, air pressure cylinders, or ball screws, or the like, for example.

Figure 6:
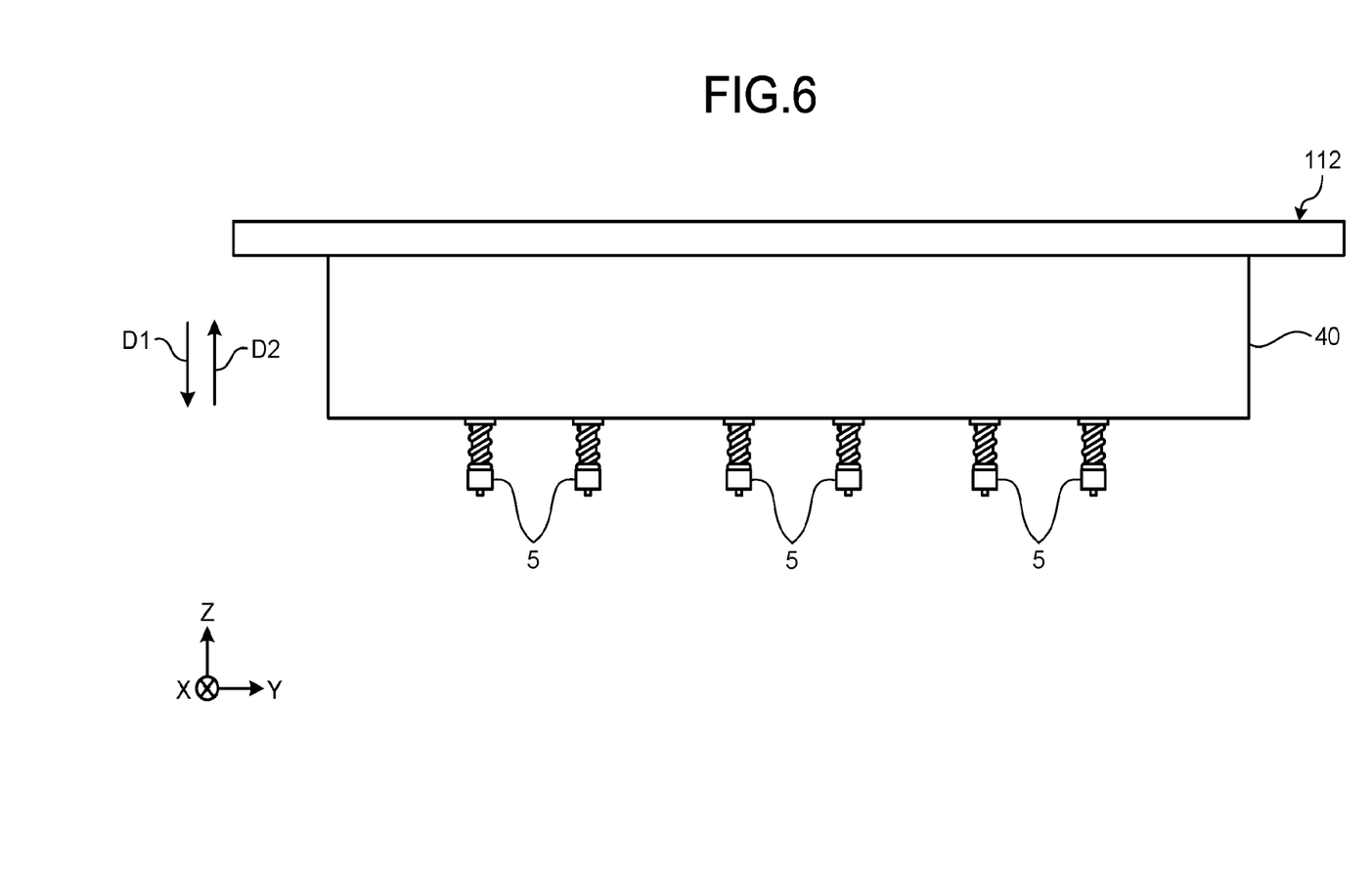
FIG. 6 is an illustrative front elevation of a probe pin module according to the second embodiment.
Figure 7:
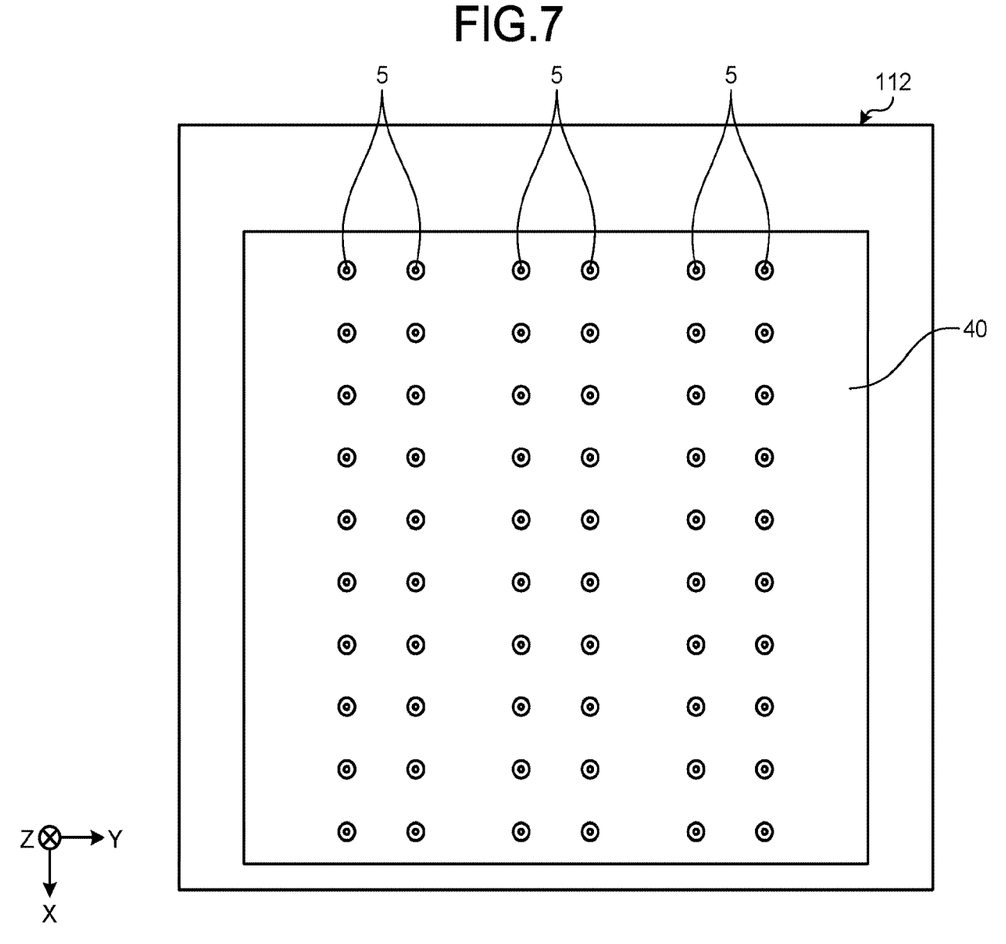
FIG. 7 is an illustrative bottom view of the probe pin module according to the second embodiment.

FIG. 6 is an illustrative front elevation of the probe pin module 112 according to the second embodiment. FIG. 7 is an illustrative bottom view of the probe pin module 112 according to the second embodiment. As illustrated in FIGS. 6 and 7, the probe pin module 112 according to the present embodiment has a different number of probe pins 5 from the probe pin module 41 according to the first embodiment. The probe pin module 112 according to the present embodiment has a plurality of two sets of probe pins 5. These pluralities of sets of probe pins 5 are supported by the base 40.

Figure 8:
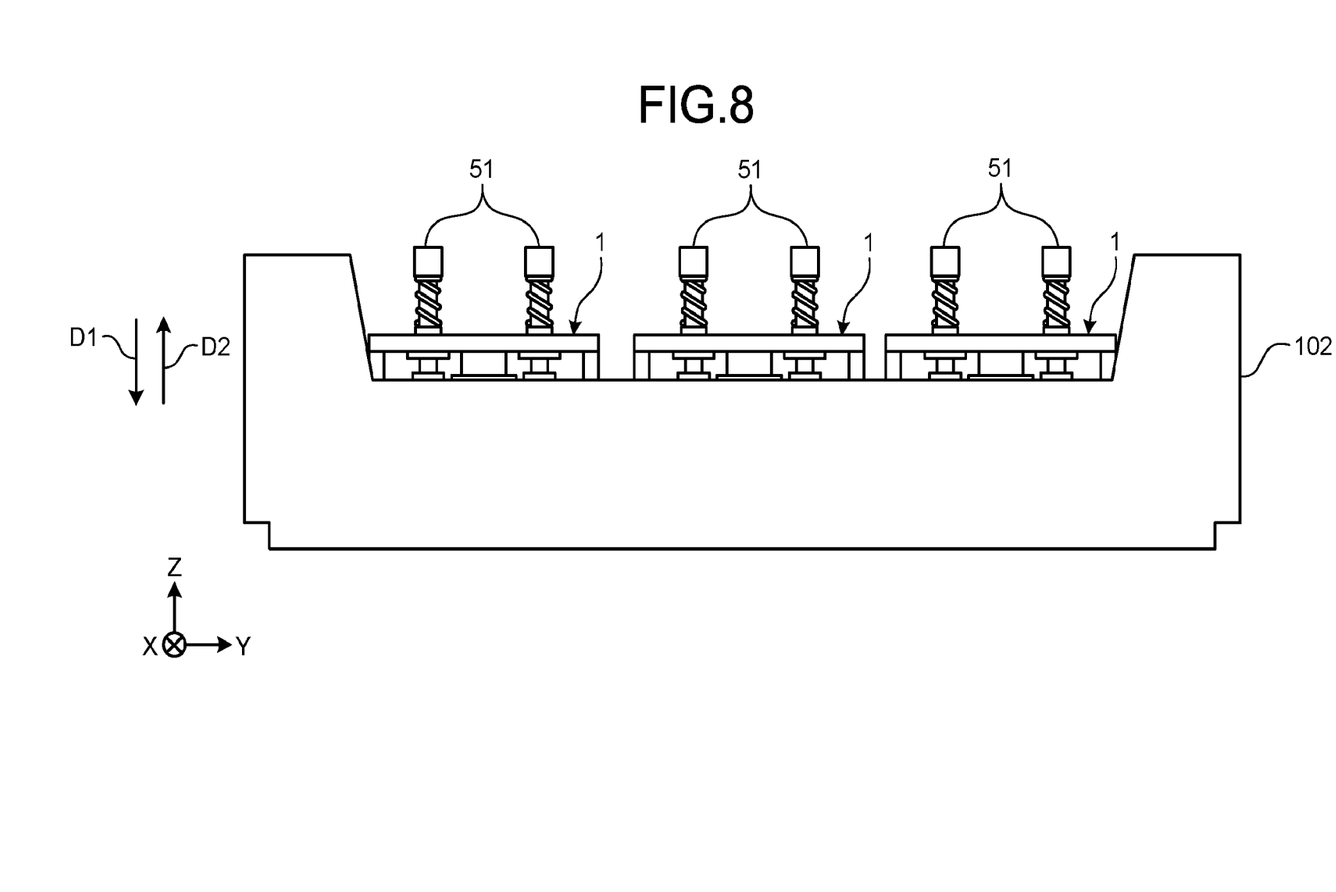
FIG. 8 is an illustrative front elevation of a tray according to the second embodiment and illustrates a state in which the tray houses probe pin inspection mechanisms.
Figure 9:
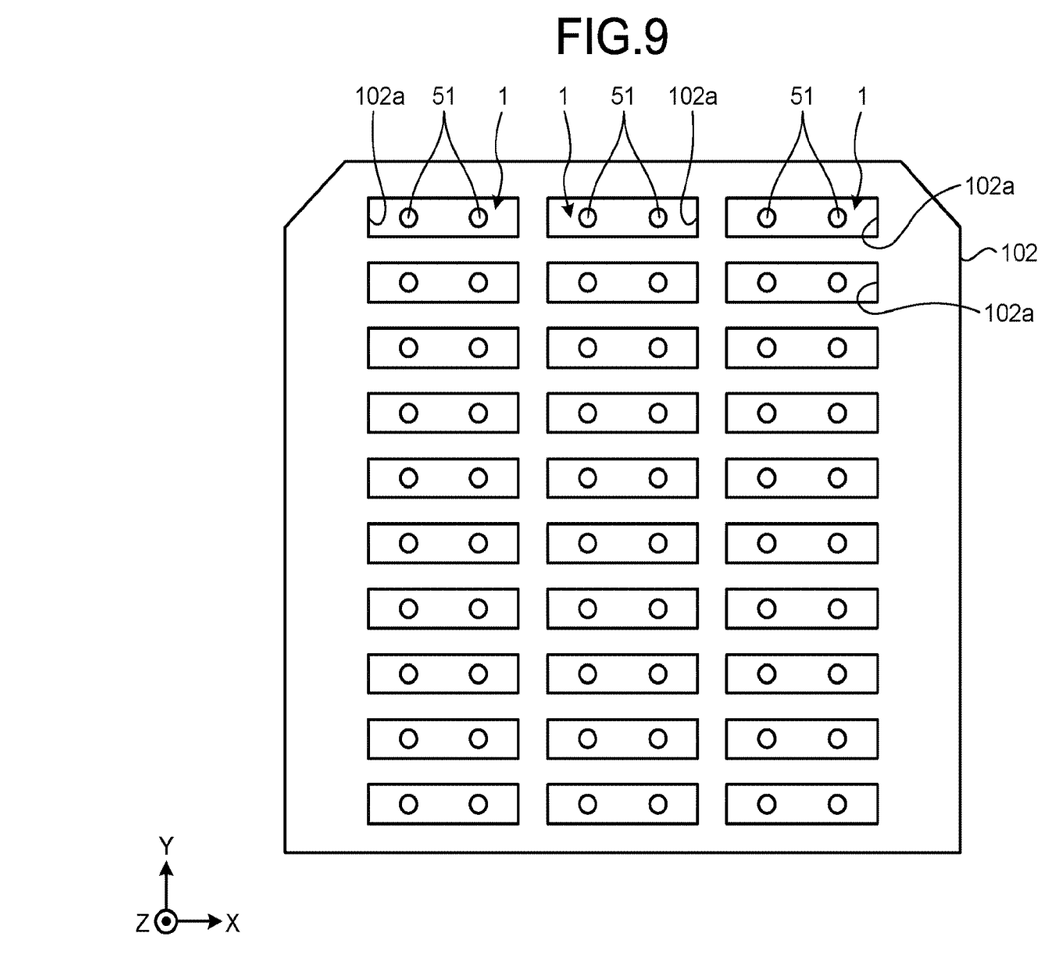
FIG. 9 is an illustrative plan view of the tray according to the second embodiment and illustrates a state in which the tray houses probe pin inspection mechanisms.

FIG. 8 is an illustrative front elevation of the tray 102 according to the second embodiment and illustrates a state in which the tray 102 houses the probe pin inspection mechanism 1. FIG. 9 is an illustrative plan view of the tray 102 according to the second embodiment and illustrates a state in which the tray 102 houses the probe pin inspection mechanism 1. As illustrated in FIGS. 8 and 9, the tray 102 is capable of housing (capable of supporting) a plurality of probe pin inspection mechanisms 1. More specifically, as illustrated in FIG. 9, the tray 102 has a plurality of recessed housing portions 102a that support the frame 53 of the base 50 of the probe pin inspection mechanisms 1. The housing portions 102a are also capable of supporting the secondary battery 10 instead of the probe pin inspection mechanisms 1. That is, the tray 102 is configured so as to be capable of selectively supporting the secondary battery 10 and the probe pin inspection mechanisms 1. The secondary battery 10 and the probe pin inspection mechanisms 1 are support objects (objects) which can be supported by the tray 102.

Figure 10:
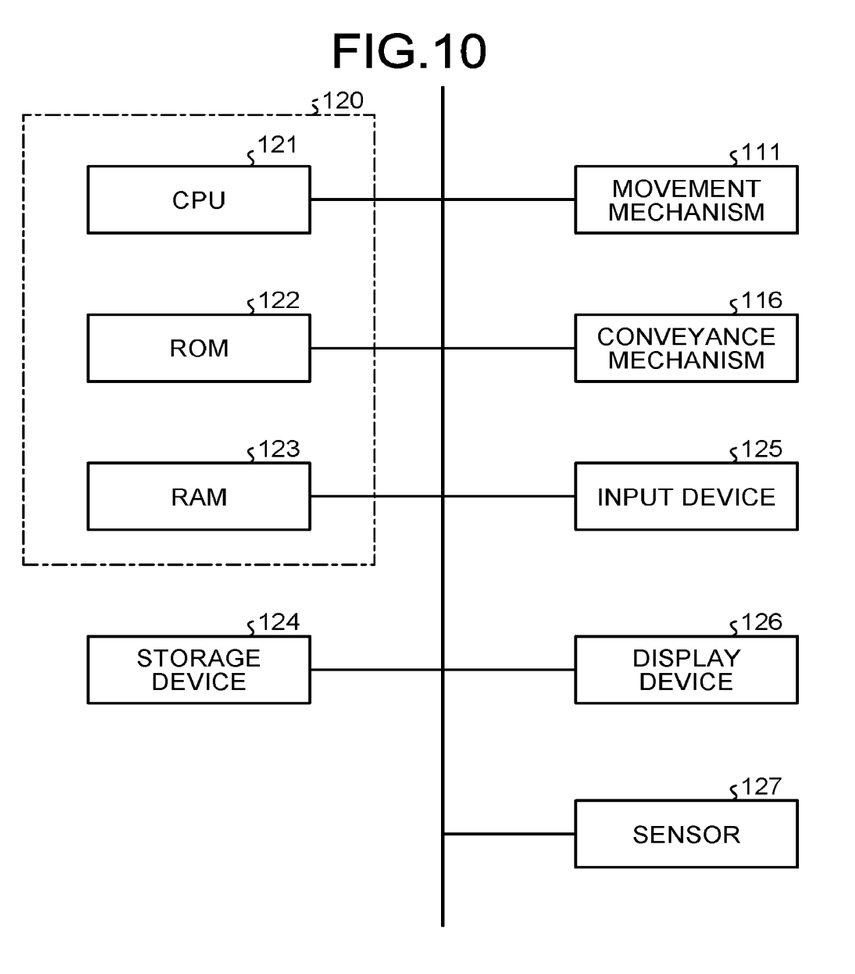
FIG. 10 is an illustrative block diagram of the charge-discharge inspection apparatus according to the second embodiment.

The tray 102 is conveyed to the support portions 114b (the pair of rails 114c) of the stage 114 by a conveyance mechanism 116 (see FIG. 10). In other words, the conveyance mechanism 116 supplies the tray 102 to the movement mechanism 111. The conveyance mechanism 116 has rails that guide the tray 102, conveyance rollers that convey the tray 102 along the rails, and a drive source such as a motor that drives the conveyance rollers (none of which are illustrated). Note that the tray 102 may also be supplied to the movement mechanism 111 by a robot arm or the like instead of by the conveyance mechanism 116. The conveyance mechanism 116 and robot arm are also referred to as supply mechanisms.

FIG. 10 is an illustrative block diagram of the charge-discharge inspection apparatus 100 according to the second embodiment. As illustrated in FIG. 10, the charge-discharge inspection apparatus 100 is provided with a control device 120. The control device 120 is a computer that controls the overall operation of the charge-discharge inspection apparatus 100 and implements various functions of the charge-discharge inspection apparatus 100. The control device 120 has a central processing unit (CPU) 121, a read-only memory (ROM) 122, and a random-access memory (RAM) 123. The CPU 121 executes various arithmetic processing and control according to various programs stored in a storage unit such as the ROM 122 or a storage device 124. The CPU 121 is an example of a hardware processor. The ROM 122 stores various programs executed by the CPU 121 and various data. The RAM 123 temporarily stores various programs executed by the CPU 121 and stores various data in a rewritable manner.

The storage device 124, the movement mechanism 111, the conveyance mechanism 116, an input device 125, a display device 126, and a sensor 127, and the like, are connected to the control device 120.

The input device 125 is configured from a keyboard or the like, for example, and inputs, to the control device 120, information corresponding to input operations with respect to the input device 125. The display device 126 is configured from a liquid crystal display or the like, for example, and displays various information under the control of the control device 120.

The sensor 127 detects the tray 102 supplied to the support portion 114b of the stage 114 of the movement mechanism 111 and outputs the detection results to the control device 120.

The control device 120 is capable of performing a well-known charge-discharge inspection of the secondary battery 10 and an inspection of the probe pins 5 (probe pin inspection processing). The charge-discharge inspection of the secondary battery 10 is, for example, processing to use the charging/discharging circuit to perform charging/discharging of the secondary battery 10 in a state in which the pair of probe pins 5 of the probe pin module 112 are made to contact the cathode terminal 23 and the anode terminal 24 of the secondary battery 10 housed in the tray 102 and to inspect whether or not the secondary battery 10 is normal on the basis of the charging/discharging results.

Next, the probe pin inspection processing performed by the control device 120 will be described.

Figure 11:
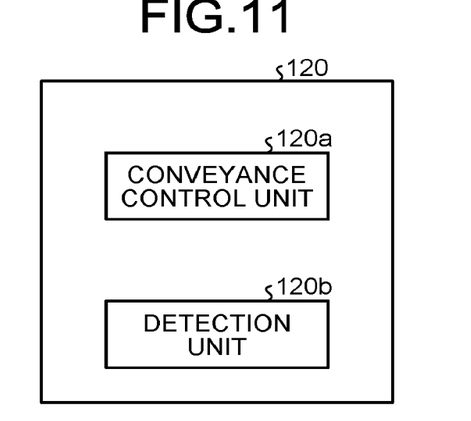
FIG. 11 is a block diagram illustrating the functional configuration of a control device according to the second embodiment.

FIG. 11 is a block diagram illustrating the functional configuration of the control device 120 according to the second embodiment. As illustrated in FIG. 11, the control device 120 has, as functional configurations, a conveyance control unit 120a and a detection unit 120b. These functional configurations are realized as a result of the CPU 121 of the control device 120 executing programs which are stored in a storage unit such as the ROM 122, the storage device 124, or the like. Note that, in the embodiment, some or all of functional configurations may also be realized by dedicated hardware (circuitry).

The conveyance control unit 120a controls the conveyance mechanism 116. The conveyance control unit 120a is also referred to as the supply control unit.

The detection unit 120b detects an abnormality of the probe pins 5 on the basis of the state between the terminals 51g of the movable bodies 51 and the conductor 55. The detection unit 120b performs probe pin inspection processing, which is detection processing to detect an abnormality of the probe pins 5, for each probe pin module 41. When the tray 102 supporting the probe pin inspection mechanism 1 is supplied to the movement mechanism 111, the detection unit 120*b* performs probe pin inspection processing to detect an abnormality of the probe pins 5 of the probe pin module 41 corresponding to the movement mechanism 111.

Figure 12:
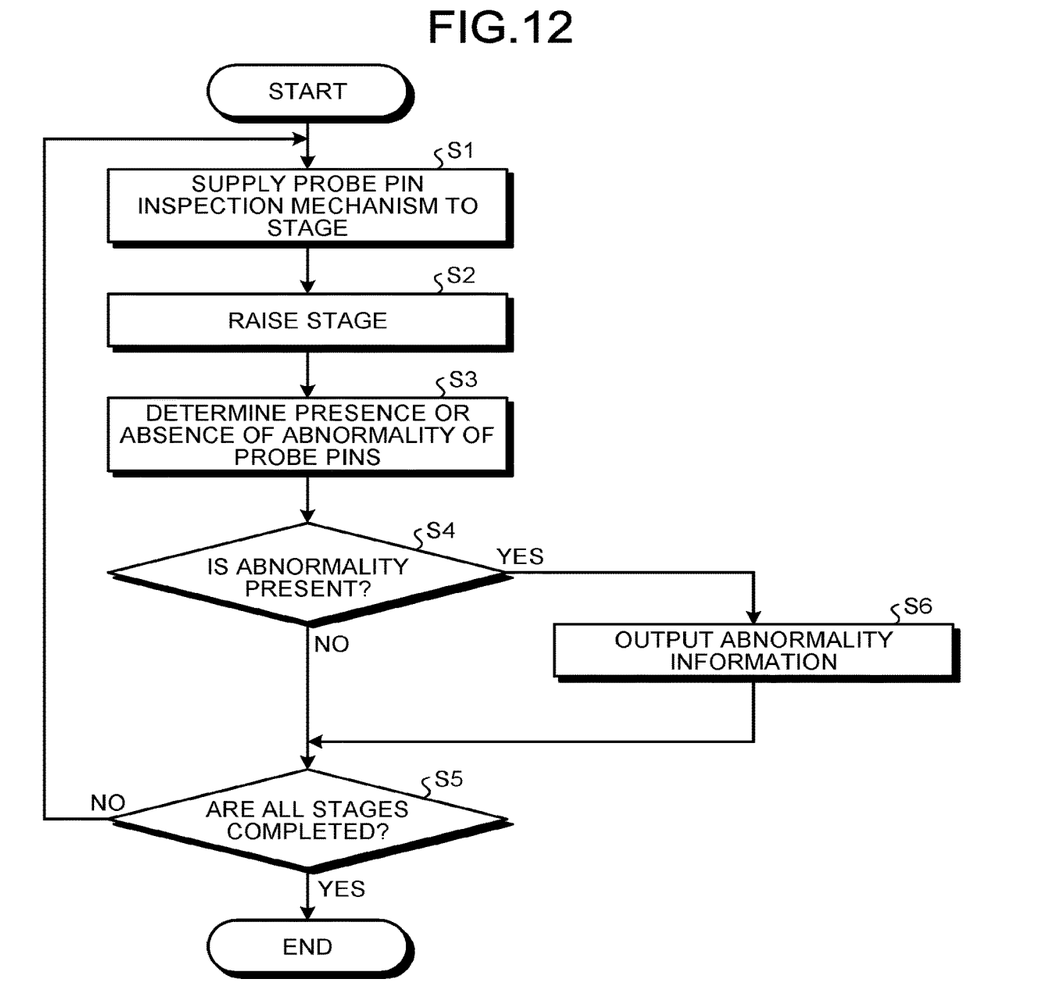
FIG. 12 is an illustrative flowchart of probe pin inspection processing as executed by the control device according to the second embodiment.

Next, the probe pin inspection processing executed by the control device 120 will be described with reference to FIG. 12. FIG. 12 is an illustrative flowchart of probe pin inspection processing as executed by the control device 120 according to the second embodiment. This example is an example in which the tray 102 is not placed on each stage 114 at the time when the probe pin inspection processing is started.

As illustrated in FIG. 12, the conveyance control unit 120*a* supplies a plurality of the probe pin inspection mechanisms 1 to the stage 114 (S1). More specifically, the conveyance control unit 120*a* conveys, to one stage 114, two trays 102 on which a plurality of probe pin inspection mechanisms 1 are placed. Furthermore, the conveyance control unit 120*a* supplies the probe pin inspection mechanisms 1 to a stage 114 for which specific information specifying the stage 114 has not been stored in a first region provided in the RAM 123. The first region is a region for storing stages 114 of which the inspection is completed. Here, information specifying the stages 114 is numbers or the like, for example.

Next, the detection unit 120*b* controls the movement mechanism 111 such that the stage 114 to which the tray 102 is supplied is raised by a predetermined amount (S2). The position where the stage 114 to which the tray 102 is supplied is raised by a predetermined amount is also referred to as the inspection position. When the probe pin inspection mechanism 1 is normal, as mentioned earlier, the terminals 51*g* are electrically connected to the conductor 55 by making contact with the lower surface of the terminals 55*a* of the conductor 55, and thus the terminals 51*g* and conductor 55 are in a conductive state. On the other hand, when the probe pin inspection mechanism 1 is abnormal, as mentioned earlier, the terminals 51*g* are electrically disconnected from the conductor 55 by separating from the lower surface of the terminals 55*a* of the conductor 55, and thus the terminals 51*g* and conductor 55 are in a non-conductive state.

Next, the detection unit 120*b* determines the presence or absence of an abnormality of the plurality of probe pins 5 supplied to the stage 114 (S3). The stage 114 to which the plurality of probe pins 5 (the trays 102) are supplied is specified on the basis of the detection results of the sensor 127. The detection unit 120*b* applies a voltage between the pair of probe pin inspection mechanisms 1 using the charging/discharging circuit in a state where the stage 114 is located in the inspection position. In this case, when the probe pin inspection mechanism 1 is normal and the terminals 51*g* and conductor 55 are in a conductive state, current flows between the pair of probe pins 5 via the probe pin inspection mechanism 1. The detection unit 120*b* uses an ammeter to detect the current flowing between the pair of probe pins 5, for example. The detection unit 120*b* determines that the pair of probe pins 5 are normal when current flows between the pair of probe pins 5. On the other hand, when current has not flowed between the pair of probe pins 5 for a specified time period, the detection unit 120*b* determines that at least one of the pair of probe pins 5 is abnormal. The detection unit 120*b* performs the foregoing processing for each of the pair of probe pins 5, that is, for each one of the probe pin inspection mechanisms 1. The detection unit 120*b* then stores, in the first region of the RAM 123, information specifying the stages 114 which have undergone inspection of the probe pin inspection mechanisms 1. The processing of S3 may also be referred to as contact check processing.

The detection unit 120*b* advances to S5 in a case where there is no abnormality in any of the plurality of probe pins 5 supplied to the stage 114, that is, upon determining that the plurality of probe pins 5 supplied to the stage 114 are all normal (S4: No).

On the other hand, the detection unit 120*b* advances to S6 in a case where it is determined that there is an abnormality in at least one of the plurality of probe pins 5 supplied to the stage 114 (S4: Yes). In S6, the detection unit 120*b* outputs abnormality information to the effect that there is an abnormality in at least one of the plurality of probe pins 5 supplied to the stage 114. More specifically, the detection unit 120*b* causes the display device 126 to display the abnormality information. The abnormality information contains information specifying stages 114.

In S5, the detection unit 120*b* determines, on the basis of the information specifying the stages 114 which is stored in the first region of the RAM 123, whether or not an inspection of the probe pins 5 has been completed for all the stages 114. The detection unit 120*b* returns to S1 in a case where an inspection of the probe pins 5 has not been completed for all the stages 114, that is, upon determining that an uninspected stage 114 is present (S5: No). On the other hand, in a case where it is determined that an inspection of the probe pins 5 has been completed for all the stages 114 (S5: Yes), the detection unit 120*b* ends the processing.

As mentioned earlier, according to the present embodiment, the charge-discharge inspection apparatus 100 is provided with the probe pin inspection mechanisms 1, and the detection unit 120*b*, which detects an abnormality of the probe pins 5 on the basis of the state between the terminals 51*g* and the conductor 55. Due to this configuration, as per the first embodiment, because it is possible to inspect the pair of probe pins 5 simultaneously (in the same process), a shortening of the time required to inspect whether the pair of probe pins 5 are normal is facilitated in comparison with a case where the pair of probe pins 5 are inspected separately.

In addition, according to the present embodiment, the charge-discharge inspection apparatus 100 includes: a probe pin module 112 including a plurality of the probe pins; a tray 102 (support tool) including, as supportable support objects, the secondary battery 10 and the probe pin inspection mechanism 1; and the movement mechanism 111 that causes the probe pin module 112 and the tray 102 to move relative to each other along the downward direction D1 to bring the probe pins 5 and the support objects supported by the tray 102 into contact with each other. Due to this configuration; it is possible to perform an inspection of the secondary battery 10 and an inspection of the probe pins 5 by using the same charge-discharge inspection apparatus 100.

Furthermore, according to the present embodiment, the tray 102 is capable of selectively supporting a plurality of secondary batteries 10 and a plurality of probe pin inspection mechanisms 1. Due to this configuration, it is possible to make shared usage of the tray 102 for the inspection of the secondary batteries 10 and the inspection of the probe pin inspection mechanisms 1.

Furthermore, according to the present embodiment, the charge-discharge inspection apparatus 100 is provided with a plurality of the probe pin modules 41, a plurality of the trays 102 provided for each of the probe pin modules 41, and a plurality of the movement mechanisms 111 provided for each of the probe pin modules 41. The detection unit 120*b* performs detection processing to detect an abnormality of the probe pins 5 for each probe pin module 41. Due to this configuration, an abnormality of the probe pins 5 can be detected for each probe pin module 41.

Moreover, according to the present embodiment, when the tray 102 supporting the probe pin inspection mechanism 1 is supplied to the movement mechanism 111, the detection unit 120b performs detection processing to detect an abnormality of the probe pins 5 of the probe pin module 41 corresponding to the movement mechanism 111. Due to this configuration, the probe pin modules 41 can be inspected sequentially.

Although several embodiments of the present invention have been described, these embodiments are presented as examples and are not intended to limit the scope of the invention. These new embodiments may be carried out using a variety of other modes, and various omissions, substitutions and modifications can be made without departing from the spirit of the invention. Such embodiments and modifications thereof are incorporated in the scope and spirit of the invention and are incorporated in the scope of the inventions set forth in the claims and their equivalents.

The invention claimed is:

1. A probe pin inspection mechanism, comprising:
   a base;
   a pair of movable bodies respectively including ends and terminals, each of the pair of movable bodies being supported by the base to be movable in a first direction from a first position with respect to the base, the ends being located in a second direction opposite to the first direction, the terminals being electrically connected to the respective ends, and the pair of movable bodies being arranged in a direction intersecting the first direction;
   a pair of movable-body elastic bodies provided for the respective movable bodies and interposed between the respective movable bodies and the base, the pair of movable-body elastic bodies elastically pressing the respective movable bodies in the second direction; and
   a conductor supported by the base, the conductor electrically connecting the terminals of the pair of movable bodies by making contact with the terminals, wherein
   the ends of the pair of movable bodies are capable of making contact with respective probe pins, and
   a state between the terminals and the conductor is switched, according to a position of the movable bodies, between a conductive state in which the terminals and the conductor are in contact with each other and a non-conductive state in which the terminals and the conductor are separated from each other.

2. The probe pin inspection mechanism according to claim 1, wherein
   the probe pins respectively include: support bodies; pins supported by the respective support bodies to be movable in the second direction and protruding in the first direction from the respective support bodies to be capable of making contact with the respective ends; and pin elastic bodies pressing the respective pins in the first direction, and
   force exerted by the movable-body elastic bodies pressing the movable bodies located in the first position in the second direction is greater than force exerted by the pin elastic bodies of the normal probe pins pressing the pins in the first direction.

3. The probe pin inspection mechanism according to claim 1, wherein
   when the movable bodies are located in the first position, the terminals and the conductor are in the conductive state, and
   when the movable bodies are located in a second position further in the first direction than the first position, the terminals and the conductor are in the non-conductive state.

4. An inspection apparatus, comprising:
   the probe pin inspection mechanism according to claim 1; and
   a detection unit configured to detect an abnormality of the probe pins based on the state between the terminals and the conductor.

5. The inspection apparatus according to claim 4, further comprising:
   a probe pin module including a plurality of the probe pins;
   a support tool including, as supportable support objects, a secondary battery and the probe pin inspection mechanism; and
   a movement mechanism that moves the probe pin module and the support tool relative to each other along the first direction to bring the probe pins and the support objects supported by the support tool into contact with each other.

6. The inspection apparatus according to claim 5, wherein the support tool is capable of selectively supporting a plurality of the secondary batteries and a plurality of the probe pin inspection mechanisms.

7. The inspection apparatus according to claim 5, further comprising:
   a plurality of the probe pin modules;
   a plurality of the support tools provided for the respective probe pin modules; and
   a plurality of the movement mechanisms provided for the respective probe pin modules, wherein
   the detection unit is configured to perform detection processing to detect an abnormality of the probe pins for each of the probe pin modules.

8. The inspection apparatus according to claim 5, wherein, when the support tool supporting the probe pin inspection mechanism is supplied to the movement mechanism, the detection unit is configured to perform detection processing to detect an abnormality of the probe pins of the probe pin module corresponding to the movement mechanism.

* * * * *